(12) United States Patent
Park et al.

(10) Patent No.: US 6,871,333 B2
(45) Date of Patent: Mar. 22, 2005

(54) BENT GATE TRANSISTOR MODELING

(75) Inventors: SangJune Park, Colorado Springs, CO (US); Robert W. Davis, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 249 days.

(21) Appl. No.: 10/265,803

(22) Filed: Oct. 7, 2002

(65) Prior Publication Data

US 2004/0068704 A1 Apr. 8, 2004

(51) Int. Cl.$^7$ ................................................. G06F 9/45
(52) U.S. Cl. ..................... 716/5; 716/4; 716/6
(58) Field of Search ................... 716/1–6, 18; 257/401, 257/276

(56) References Cited

U.S. PATENT DOCUMENTS

| | | | | |
|---|---|---|---|---|
| 6,166,560 A | * | 12/2000 | Ogura et al. | .................. 326/41 |
| 6,204,542 B1 | * | 3/2001 | Kinoshita et al. | ............ 257/401 |
| 6,249,900 B1 | * | 6/2001 | Kotani et al. | .................. 716/5 |
| 6,713,793 B1 | * | 3/2004 | Suzuki et al. | ................ 257/276 |
| 2003/0226128 A1 | * | 12/2003 | Arai et al. | ..................... 716/10 |

* cited by examiner

*Primary Examiner*—Matthew Smith
*Assistant Examiner*—Binh Tat
(74) *Attorney, Agent, or Firm*—Luedeka, Neely & Graham, P.C.

(57) ABSTRACT

A method of characterizing a total width and an overall effective length for a bent gate. The bent gate is divided into logical portions, and each of the logical portions is designated as one of a bent portion, a corner portion, and a straight portion. A corner portion gate width and a corner portion effective length are computed for each of the logical portions designated as a corner portion. Similarly, a bent portion gate width and a bent portion effective length are computed for each of the logical portions designated as a bent portion. Likewise, a straight portion gate width and a straight portion effective length are computed for each of the logical portions designated as a straight portion. The total width of the bent gate is computed from the corner portion gate width, the bent portion gate width, and the straight portion gate width. Similarly, the overall effective length of the bent gate is computed from the corner portion effective length, the bent portion effective length, and the straight portion effective length.

20 Claims, 7 Drawing Sheets

$L_{corner} = R \cdot \tan(22.5°)$

<u>Width</u> = ARC along corner region
 $= 2 \cdot \pi \cdot R \cdot 45°/360°$

<u>Leff</u>  $= L_{gate} / \cos(22.5°)$ $L_{eff}$ = Area or Bent Region / Width
       = $L_{bent} \cdot L_{gate} / $ Width $L_{bent}$ = $\sqrt{2} \cdot L_{jog} - 2 \cdot R \cdot \tan(22.5°)$ = Width <u>$L_{eff}$</u>  = $L_{gate}$ Width = Lstr − 2·R·tan(22.5°) − Lgate·tan(22.5°)
     = Lstr − (2·R+Lgate)·tan(22.5°)
*** Width at the shorter side Leff = Lgate Critical Lstr value : Lbent,crit Lbent,crit = 2 · R · tan(22.5°)
→ Ljog,crit = Lbent,crit / √2

If Ljog > Ljog,crit, Bent Portion

If Ljog ≤ Ljog,crit,

For one corner :
Width,corner = π·R·45°/360° + Lbent
            = π·R·45°/360° + √2·Ljog
Lgate,eff = Lgate,str / cos(22.5°)

Critical Lstr value : Lstr,crit

Lstr,crit − Lgate • tan(22.5°) = 2 • R • tan(22.5°)

→ Lstr,crit = tan(22.5°) { 2•R + Lgate}

If Lstr > Lstr,crit, Straight Portion

If Lstr ≤ Lstr,crit,

For one corner :
Width,corner = π • R • 45°/360° +Lstr/2
Lgate,eff = Lgate_str / cosφ

φ = arctan(Lstr,crit/Lstr)

$L_{str,crit} = \tan(22.5°) \{ 2 \cdot R + L_{gate}\}$ $L_{jog,crit} = 2 \cdot R \cdot \tan(22.5°)/\sqrt{2}$

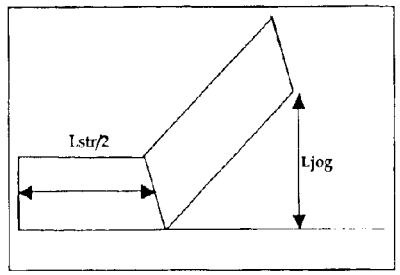

| Category | Straight Portion | Corner Portion | Bent Portion |
|---|---|---|---|
| Lstr > Lstr,crit<br>Ljog > Ljog,crit | W = Lstr·tan(22.5°)[2·Rgst]<br>or Lstr/2 - R·tan(22.5°)***<br>L = Lgstr | W = 2π·R·45°/360°<br>L = Lgst/cos(22.5°) | W = √2·Ljog - 2·R·tan(22.5°)<br>L = Lgbnt |
| Lstr ≤ Lstr,crit<br>Ljog > Ljog,crit | W = 0<br>L = Lgstr | W = π·R·45°/360 + Lst/2<br>L = Lgst/cos[F·φ]<br>φ = arctan(Lstr,crit/Lstr) | W = √2·Ljog - 2·R·tan(22.5°)<br>L = Lgbnt |
| Lstr > Lstr,crit<br>Ljog ≤ Ljog,crit | W = Lstr·tan(22.5°)[2·Rgst]<br>or Lstr/2 - R·tan(22.5°)***<br>L = Lgstr | W = R·tan(22.5°)/2 + Ljog/2<br>L = Lgst/cos(22.5°) | W = 0<br>L = Lgbnt |
| Lstr ≤ Lstr,crit<br>Ljog ≤ Ljog,crit | W = 0<br>L = Lgstr | W = Lst/2 + √2·Ljog/2<br>L = Lgst/cos[F·φ]<br>φ = arctan(Lstr,crit/Lstr) | W = 0<br>L = Lgbnt |

Note: *** for line-end
Lgstr: Gate Length at Straight Portion
Lgbnt: Gate Length at Bent Portion

Fig. 10

BENT GATE TRANSISTOR MODELING

FIELD

This invention relates to the field of integrated circuit fabrication. More particularly, this invention relates to modeling bent transistor gate geometries for use in circuit design simulations.

BACKGROUND

There is continual pressure on the microelectronics industry to produce integrated circuits that are smaller, faster, and more powerful. As a part of the effort to produce such integrated circuits, the size of individual structures within the integrated circuits is constantly reduced. However, sometimes a desired reduction in size brings with it an attendant change in another property of the device which is not desired. For example, reducing the size of a MOS transistor is generally considered beneficial, as by so doing the number of transistors that can fit within a given geometry is increased, yielding an integrated circuit that is commensurately more powerful. However, as the transistor size is reduced, so also is the width of the gate generally reduced, which often leads to undesired changes in the electrical characteristics of the transistor.

One method of compensating for this undesired change in the electrical characteristics of the transistor is to design it with a gate that does not pass straight through the transistor, but takes a longer path through the transistor instead. Such designs are often referred to as bent gate transistors. One type of bent gate transistor is a forty-five degree bent gate transistor 12, such as depicted in FIG. 1. In this example, the bent gate transistor 12 is formed as part of an integrated circuit 10. The gate 14 has at one end a first straight region 16, a first corner region 18 with a nominal forty-five degree bend, a bent region 20, a second corner region 22 with a nominal forty-five degree bend, and a second straight region 24. In this manner, there is a greater width of the gate 14 within the transistor 12 than there would be if the gate just cut straight through the transistor 12.

Unfortunately, even though such bent gate transistors are commonly used in the microelectronics industry, they are not well characterized. By this it is meant that traditional integrated circuit modeling routines, such as SPICE, do not adequately predict the behavior of such transistors. Thus, bent gate transistors are typically either over-specified so as to ensure acceptable minimum operating characteristics, or tend to require a lengthy development cycle including many iterations of design optimization.

What is needed, therefore, is a method for modeling bent gate transistors so that the development cycle of integrated circuit designs employing such transistors can be reduced, and the final operating characteristics of the transistors can be better predicted.

SUMMARY

The above and other needs are met by a method of characterizing a total width and an overall effective length for a bent gate. The bent gate is divided into logical portions, and each of the logical portions is designated as one of a bent portion, a corner portion, and a straight portion. A corner portion gate width and a corner portion effective length are computed for each of the logical portions designated as a corner portion. Similarly, a bent portion gate width and a bent portion effective length are computed for each of the logical portions designated as a bent portion. Likewise, a straight portion gate width and a straight portion effective length are computed for each of the logical portions designated as a straight portion. The total width of the bent gate is computed from the corner portion gate width, the bent portion gate width, and the straight portion gate width. Similarly, the overall effective length of the bent gate is computed from the corner portion effective length, the bent portion effective length, and the straight portion effective length.

In this manner, the bent gate is better defined for circuit simulation programs, which enables a more characterized design for an integrated circuit. Thus, over designing of the transistor is not required, nor are iterations of design revisions required to properly tailor the transistor to what is desired. Thus, integrated circuits can be developed with a shorter development time, which means that they are less expensive to develop. Further, the final transistors can be generally smaller in size, because an over-design of the transistor is not required.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 10 is a table of the modeling processes to be used for the different regions of a bent gate, as selected depending at least in part on the gate region geometry.

DETAILED DESCRIPTION

Figure 2:
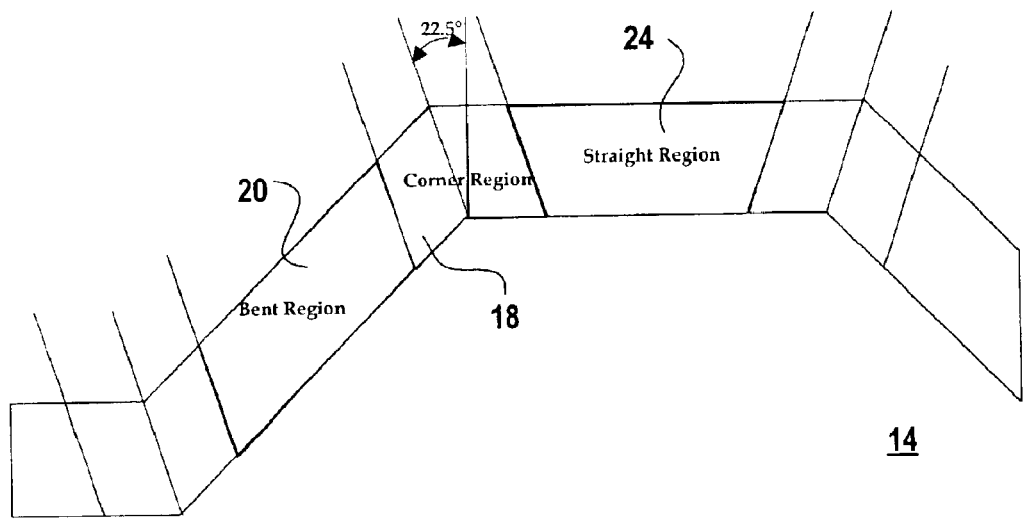
FIG. 2 is a top plan view of a bent gate, depicting various parts and measurements for the bent gate.

With reference now to FIG. 2, there is depicted a bent gate 14 with a bent region 20, a corner region 18, and straight region 24. It is appreciated that a bent gate 14 may have several each bent regions 20, corner regions 18, and straight regions 24. The methods described herein are generally applicable to such configurations. However, the simpler embodiments are described herein so as to provide an understandable example of the methods that may then be applied to more complex designs.

The bent gate 14 is preferably broken down into one or more of these three regions by methods as described in more detail below. The characteristics of the bent gate 14 are then determined by first determining the characteristics of each such region, and then considering the regions to be connected in a parallel circuit as, Bent Gate=ΣStraightPortion₁+ΣBentPortion₁+ΣCornerPortion, Conversely, transistor modeling systems such as SPICE typically make automatic use of differential gate width effects, or delta-w effects, in their calculations. Such delta-w effects are used in those simulation tools to account for the width narrowing phenomenon generally caused by photo-lithographic effects and lateral diffusion during processing. However, use of such an approach has been found by the inventors to be less accurate than the parallel resistor network calculations to describe effective gate width and gate length, as described herein.

Transistor current and voltage characteristics are expressed by the first equation below. The second equation then provides an expression for the resistance of the transistor:

$$I_{DRAIN} = \mu C \frac{W_{eff}}{L_{eff}} f(V_{GATE}, V_{DRAIN})$$

$$R = \frac{V}{I} \approx \frac{L_{eff}}{W_{eff}}$$

Figure 3:
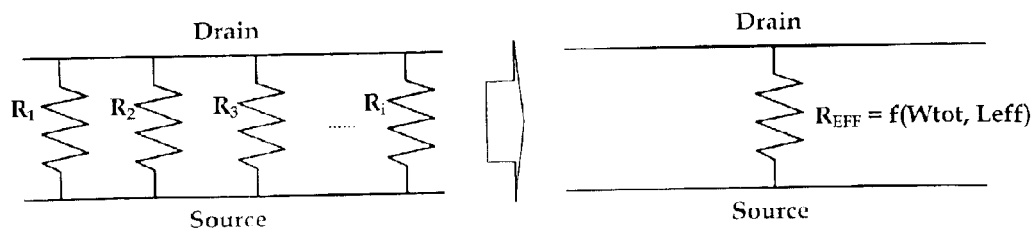
FIG. 3 is a schematic representation of one electrical basis for a bent gate modeling.

The parallel transistor connection is then equivalent to the parallel resistor network as first depicted in FIG. 3, which is transformed with Ohm's law for the parallel connection of resistors with the effective resistance as finally depicted in FIG. 3. The method of determining the effective resistance is given below. This concept is then used as an analogy to determine the total width ($W_{tot}$) and the effective length ($L_{eff}$) for the gate 14, where R=L/W.

$$\frac{1}{R_{TOT}} = \frac{1}{R_1} + \frac{1}{R_1} + \frac{1}{R_1} + \ldots + \frac{1}{R_i}$$

$$\frac{W_{TOT}}{L_{TOT}} = \frac{W_1}{L_1} + \frac{W_2}{L_2} + \frac{W_3}{L_3} + \ldots + \frac{W_i}{L_i}$$

$$L_{EFF} = \frac{W_{TOT}}{\left(\frac{W_1}{L_1} + \frac{W_2}{L_2} + \frac{W_3}{L_3} + \ldots + \frac{W_i}{L_i}\right)}$$

$$W_{TOT} = W_1 + W_2 + W_3 + \ldots + W_i$$

Thus, the total width of a bent gate 14 and the effective length of a bent gate 14 are determined by first computing the width and effective length of each portion of the bent gate 14, as described in more detail below, and then using these parameters in the equations as given above to calculate the total width and overall effective length for the bent gate 14.

Figure 1:
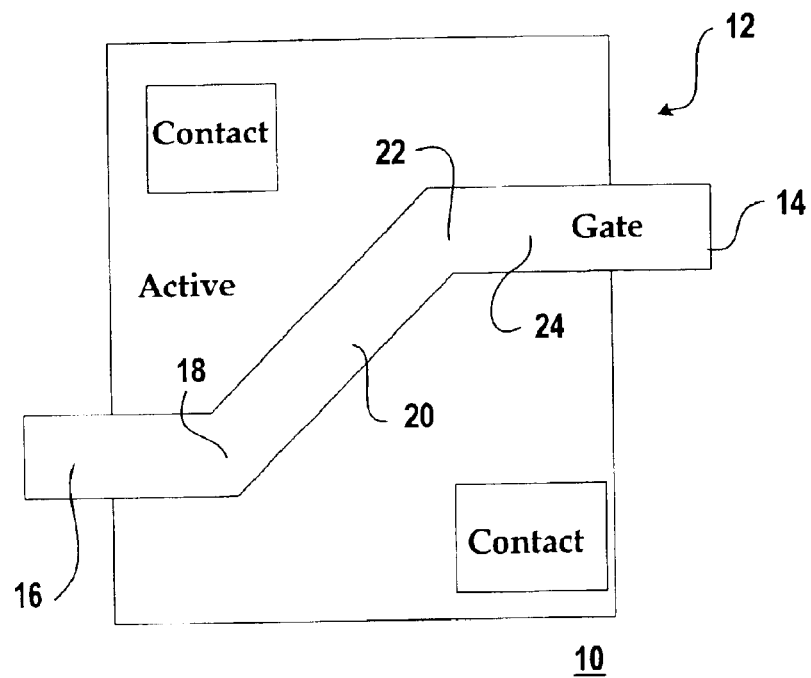
FIG. 1 is a top plan view of a transistor, depicting an embodiment of a bent gate within the transistor.
Figure 4:
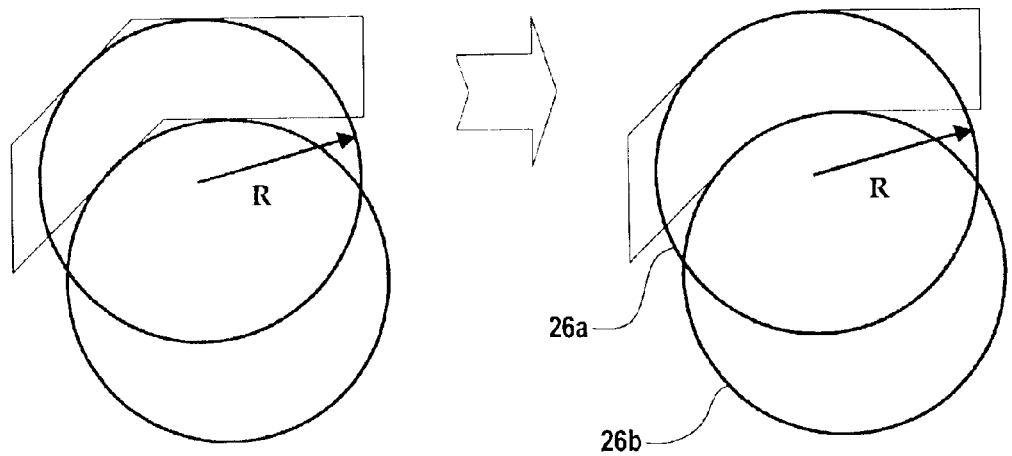
FIG. 4 depicts a correction and basis for understanding the corner regions of a bent gate.

In gates as actually produced during a photolithographic process, the corner regions 18 of transistors do not actually have the crisp, perfect corners as depicted in FIGS. 1 and 2, due to issues such as optical proximity effects. Optical proximity effects are generally introduced due to the resolution limits of the optical source that is used for the gate definition process. This effect tends to produce a rounded corner, rather than a crisp corner, as depicted in FIG. 4. FIG. 4 also introduces the concept of geometry correction circles 26a and 26b, where circle 26a describes an outside radius for a corner region 18, and circle 26b describes an inside radius for a corner region 18. Preferably, the inside radius is equivalent to the outside radius.

Figure 5:
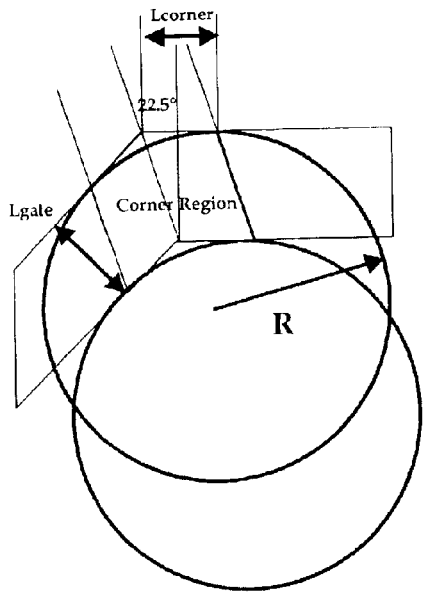
FIG. 5 depicts a geometric representation for a corner region of a bent gate.

As geometrically depicted in FIG. 5, the corner length is determined as the radius times the tangent of the half angle, or 22.5 degrees for a forty-five degree angle. This value would change, of course, for different corner angles. The width of the corner region 18 is given as the arc along the corner region 18, which is 2πR(45/360), where the last term is the corner angle in degrees divided by 360 degrees. The effective length of the corner region 18 is then given as the nominal gate length divided by cos(22.5).

Figure 6:
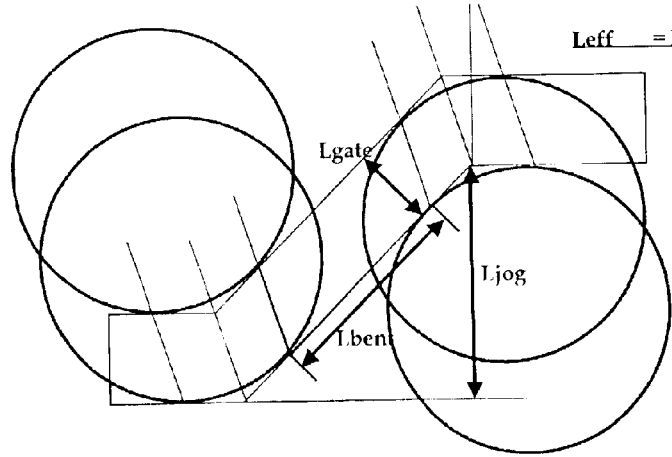
FIG. 6 depicts a geometric representation for a bent region of a bent gate.

With reference now to FIG. 6, the calculations in regard to the bent region 20 of the bent gate 14 are now described. The effective length of the bent region 20 is determined by dividing the area of the bent region 20 by the width of the bent region 20, which as depicted is equivalent to ($L_{bent}$) $L_{gate}$/Width. $L_{bent}$ is defined to be the same as Width. Thus, the effective length is equal to $L_{gate}$ as depicted. $L_{bent}$, or in other words the width of the bent portion 20, is given as:

√2·Ljog−2·R·tan(22.5)

Figure 7:
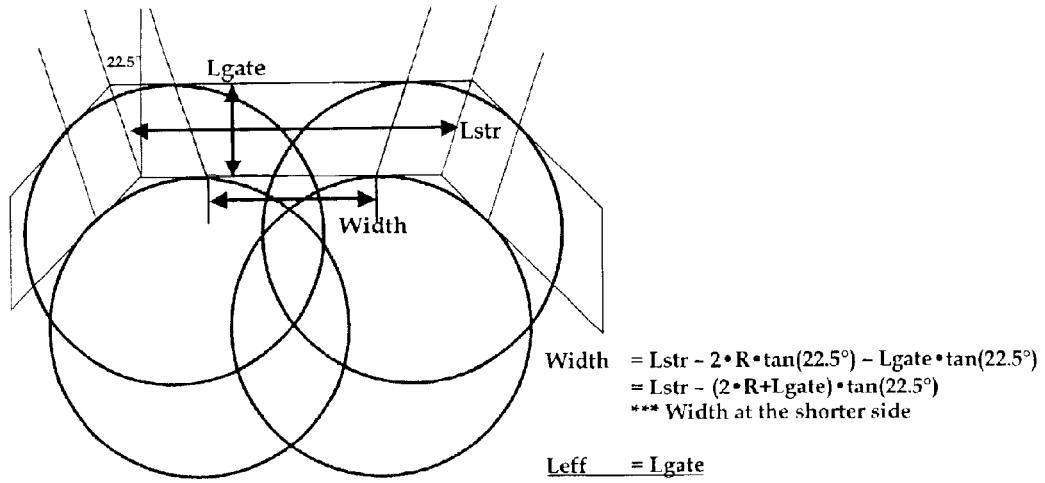
FIG. 7 depicts a geometric representation for a straight region of a bent gate.

With reference now to FIG. 7, the calculations in regard to the straight portion 24 of the bent gate 14 are now described. The effective length of the straight portion 24 is defined as $L_{gate}$, similar to that as defined above for the bent portion 20. The width of the straight portion 20 is given as:

Lstr−2·R·tan(22.5)−Lgate·tan(22.5)

or

Lstr−(2·R+Lgate)·tan(22.5)

Thus, the expressions determined above for width and effective length for each of the corner region 18, bent region 20, and straight region 24 can be used to determine such for each region in a bent gate 14 configuration. These values are then combined using the equations as given above to determine the total width and the overall effective length for the bent gate 14. Again, it is appreciated that if the bent gate 14 is bent by an angle that is other than forty-five degrees, then the numbers used above as corner angles and half angles will change accordingly. However, the present invention is particularly applicable to bent gates 14 with forty-five degree bent angles.

Figure 8:
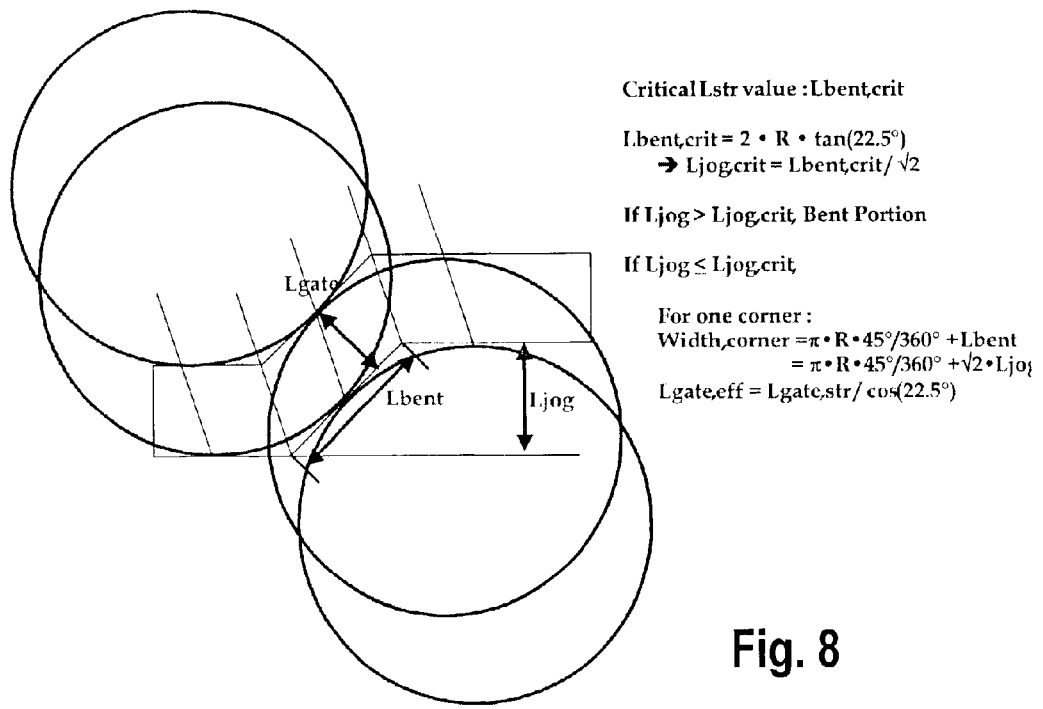
FIG. 8 depicts a geometric representation for a short bent region of a bent gate.
Figure 9:
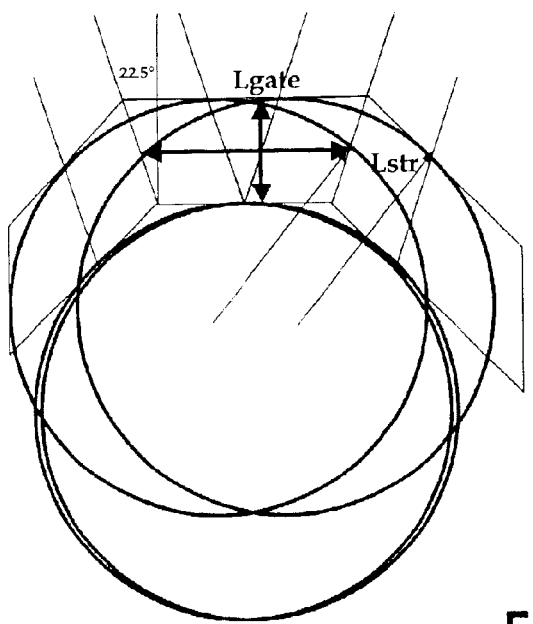
FIG. 9 depicts a geometric representation a the short straight region of a bent gate.

The expressions as given above are preferably modified to some extend for so-called short portions. For example, a short bent portion 20 is depicted in FIG. 8. The critical feature for determining a short bent portion 20 is when there is effectively no bent portion 20 between two corner portions 18, according to the definitions of the portions as generally given above and depicted in the various figures. However, it has been determined that some accounting for the logical bent portion 20, or short bent portion 20, between the two corner portions 18 is preferred, and yields a more accurate modeling method.

For example, the critical values are defined as $L_{bent,crit}$ and $L_{jog,crit}$. $L_{bent,crit}$ is equal to (2R)tan(22.5). $L_{jog,crit}$ is then equal to $L_{bent,crit}$ divided by the square root of two. If $L_{jog}$ as determined above is greater than $L_{jog,crit}$, then a standard calculation for the bent portion 20 is performed as given above. However, if $L_{jog}$ is less than or equal to $L_{jog,crit}$, then the calculations for an adjoining corner portion 18 are preferably modified, with the width of the corner portion 18 determined as πR(45/360)+(√2)$L_{jog}$, and the effective gate length of the corner portion 18 determined as $L_{gate,str}$/cos (22.5), where $L_{gate,str}$ is from the straight portion 24 adjacent the one corner portion 18.

Similar to that as described above for the short bent portion 20, the method described above is preferably modified for short straight portions 24, where an adjoining corner portion 18 meets at the interior or shorter length of the short straight portion 24. A short straight portion 24 is defined with a critical value of $L_{str,crit}$, which is equal to tan(22.5) (2R+$L_{gate}$). If $L_{str}$ as defined above and in the figures is greater than $L_{str,crit}$, then standard methods are used for the determination of the width and length of the straight portion 24, as described above. However, if $L_{str}$ is less than or equal to $L_{str,crit}$, then for the adjoining corner portion 18 the calculations are preferably modified, with the width of the corner portion 18 given as $\pi R(45/360)+L_{str}/2$, and the effective gate length of the corner portion 18 given as $L_{str}/\cos \phi$, where $\phi$ equals arctan ($L_{str,crit}/L_{str}$).

The actual characteristics of different types of transistor gates tend to be different, due to differing sensitivities to geometry changes. To account for this behavior, a geometry factor is introduced in the method as described herein. Thus, in the case for the short straight portion 24 as given above, where $L_{str}$ is less than or equal to $L_{str,crit}$, the effective gate length of the short straight portion 24 is preferably modified to be equal to $L_{str}/\cos (F\phi)$, where F is the geometry factor.

FIG. 10 provides a summary table of the various steps of the method which apply in the different circumstances as described above and as depicted in the figures.

As mentioned above, the performance of standard cells, and other circuits that are sufficiently small for such analysis, is typically established by gate level simulation with a program such as SPICE. The descriptions of the transistors that are necessary for such simulations are in files called decks, of a format appropriate for the simulator being used. While hand generation of the decks is possible, common practice is to have an extraction program generate them from a file that contains the physical transistor layout information, such as a CAD file. Instructions on how the program is to perform that extraction are contained in a rules file. The preferred embodiment of this invention is to modify the rules file to include the bent gate equations as described above.

For example, the following is a portion of the code from a rules file so modified:

```
if      (ws_segStrIslEdgeAVE > ws_crit_segStrIsl
    &&  ws_segStrBtw45sEdgeAVE > ws_crit_segStrBtw45s
    &&  wbAVE <= wb_crit)
    {
weff_segStrIslEdge = ws_segStrIslEdgeAVE - (0.414214*.25e-06)
```

Figure 11:
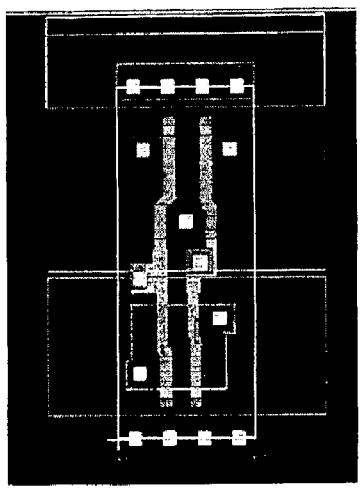
FIG. 11 is a top plan view of a first integrated circuit to which the present method is applied.

Running the extraction program with modified rules on the deck created for the circuit generally depicted in FIG. 11 results in the following transistor description for SPICE simulation:

MP02 Z B VDD VDD PM_HP W=1.24642u L=0.117501u AD=0.219244p AS=0.44515p PD=1.64122u+PS=3.17142u

MP01 Z A VDD VDD PM_HP W=1.23192u L=0.117165u AD=0.216694p AS=0.427437p PD=1.62213u+PS=3.19192u

MN02 N1N6 B VSS VSS NM_HP W=0.986568u L=0.118159u AD=0.118173p AS=0.329775p PD=1.22707u+PS=2.72657u

MN01 Z A N1N6 VSS NM_HP W=0.982426u L=0.11804u AD=0.33675p AS-0.117677p PD=2.79243u+PS=1.22192u

The same extraction performed using a rules files that was not modified with the bent gate equations according to the present invention resulted in the following:

MP02 Z B VDDVDD PM_HP W=1.246u L=0.115u AD=0.219244p AS=0.44515p PD=1.64122u+PS=3.17142u

MP01 Z A VDD VDD PM_HP W=1.232u L=0.115u AD=0.216694p AS=0.427437p PD=1.62213u+PS=3.19192u

MN02 N1N6 B VSS VSS NM_HP W=0.9866u L=0.115u AD=0.118173p AS=0.329775p PD=1.22707u+PS=2.72657u

MN01 Z A N1N6 VSS NM_HP W=0.9824u L=0.115u AD=0.33675p AS=0.117677p PD=2.79243u+PS=1.22192u

Where the parameters that are different from the modified case are in italics. Thus, it is seen that the bent gate equations provide an impact on the calculated parameters that are used in a transistor simulation program.

Figure 12:
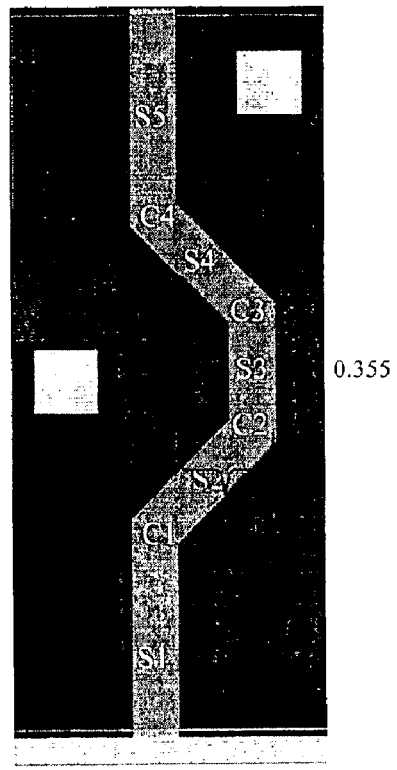
FIG. 12 is a top plan view of a second integrated circuit to which the present method is applied.

With reference now to FIG. 12, there is depicted a bent gate 14 with specific portions delineated. A more detailed description of the application of the invention is presented in regard to the bent gate 14 depicted. The segments, or bent portions and straight portions, are labeled S1–S5 and the corner portions are labeled C1–C4. The dimensions are in microns.

As a part of the method, the $L_{str}$ segments are identified and measured. In this example both S1 and S5 have center-line distances of 0.4975 microns. That value is obtained by averaging the 0.525 micron length and 0.470 micron length along their two sides. Since they are both line-end segments, total $L_{str}/2$=0.4975 microns. Similarly, for the non line-end segment S3, $L_{str}$=0.30 microns. The $L_{jog}$ segments, or bent portions S2 and S4, are identified, and $L_{jog}$ is measured as 0.250 microns. The critical dimensions are calculated. The following constants are used for the process in this example:

R=0.35 microns
F=1

The gate lengths for the straight and bent segments of the sample transistor are:

$L_{str}$=0.115 microns
$L_{bnt}$=0.1202 microns

With these values:

$L_{str,crit}$=tan(22.5°)*(2*R+$L_{str}$)=0.3376 microns
$L_{jog,crit}$=2*R*tan(22.5°)/√2=0.205 microns In comparing the line segments to the critical values:

| | |
|---|---|
| S1 | $L_{str} > L_{str,crit}$ |
| S2 | $L_{jog} > L_{jog,crit}$ |
| S3 | $L_{str} <= L_{str,crit}$ |
| S4 | $L_{jog} > L_{jog,crit}$ |
| S5 | $L_{str} > L_{str,crit}$ |

The corner portions are also categorized:

| Corner | Stir segment | Jog | Category |
|---|---|---|---|
| C1 | S1 | S2 | $L_{str} > L_{str,crit}/L_{jog} > L_{jog,crit}$ |
| C2 | S3 | S2 | $L_{str} <= L_{str,crit}/L_{jog} > L_{jog,crit}$ |
| C4 | S3 | S4 | $L_{str} <= L_{str,crit}/L_{jog} > L_{jog,crit}$ |
| C5 | S5 | S4 | $L_{str} > L_{str,crit}/L_{jog} > L_{jog,crit}$ |

With the characterizations as completed above, the equations can be applied to calculate the width and effective length for each of the line segments, or in other words the straight portions and the bent portions:

| Segment | W Equation | W Value | L equation | L value |
|---------|-----------|---------|-----------|---------|
| S1 | $L_{str}/2 - R*\tan(22.5°)$ | 0.352525 | $L_{str}$ | 0.115 |
| S2 | $L_{jog}*\sqrt{2} - 2*R*\tan(22.5°)$ | 0.063604 | $L_{bnt}$ | 0.1202 |
| S3 | 0 | 0 | $L_{str}$ | 0.115 |
| S4 | $L_{jog}*\sqrt{2} - 2*R*\tan(22.5°)$ | 0.063604 | $L_{bnt}$ | 0.1202 |
| S5 | $L_{str}/2 - R*\tan(22.5°)$ | 0.352525 | $L_{str}$ | 0.115 |

Similarly, the equations can be applied to calculate the width and effective length for each of the corner portions:

| Corner | W Equation | W Value | L equation | L value |
|--------|-----------|---------|-----------|---------|
| C1 | $2*\pi*R*45°/360°$ | 0.274889 | $L_{str}/\cos(22.5°)$ | 0.1245 |
| C2 | $\pi*R*45°/360° + Lstr/2$ | 0.287445 | $L_{str}/\cos(F*\arctan(L_{str,crit}/L_{str}))$ | 0.1731 |
| C3 | $\pi*R*45°/360° + Lstr/2$ | 0.287445 | $L_{str}/\cos(F*\arctan(L_{str,crit}/L_{str}))$ | 0.1731 |
| C4 | $2*\pi*R*45°/360°$ | 0.274889 | $L_{str}/\cos(22.5°)$ | 0.1245 |

Finally, the total width and the overall effective length for the bent gate is computed as given below:

$$W = W_{S1} + W_{S2} + W_{S3} + W_{S4} + W_{S5} + W_{S6} + W_{S7} +$$
$$W_{C1} + W_{C2} + W_{C3} + W_{C4}$$
$$= 0.352525 + 0.063604 + 0 + 0.63604 + 0.352525 +$$
$$0.274889 + 0.287445 + 0.287445 + 0.274889$$

Therefore, W=1.94692 microns.

$$L = W / (W_{S1}/L_{S1} + W_{S2}/L_{S2} + W_{S3}/L_{S3} + W_{S4}/L_{S4} +$$
$$W_{S5}/L_{S5} + W_{C1}/L_{C1} + W_{C2}/L_{C2} + W_{C3}/L_{C3} + W_{C4}/L_{C4})$$
$$= 1.94692/(.352525/.115 + .063604/.1202 + 0 +$$
$$.063604/.1202 + .352525/.115 + .274889/.124475 +$$
$$.287445/.1731 + .287445/.1731 + .274889/.124475)$$

Therefore, L=0.1311 microns.

These computed values length and width are then used in the transistor simulations, such as in SPICE simulations. In one preferred embodiment, the steps as described above are coded into the rules file for an extraction tool that reads layout data and generates the SPICE simulation input files. It is again appreciated that while the invention is particularly applicable to forty-five degree bent gates, it may be applied to other angles of bent gates as well, with appropriate adjustments to the equations as given above. For example, whenever the value 22.5 is used in the equations above, this is the half angle value. If a corner angle other than forty-five degrees is use, then the half angle value changes commensurately. Similarly, whenever the value forty-five is used in the equations above, this is the corner angle value. If a corner angle other than forty-five degrees is used, then the corner angle value also changes commensurately.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of characterizing a total width and an overall effective length for a bent gate, comprising the steps of:

dividing the bent gate into logical portions, designating each of the logical portions as one of a bent portion, a corner portion, and a straight portion, computing a corner portion gate width and a corner portion effective length for each of the logical portions designated as a corner portion, computing a bent portion gate width and a bent portion effective length for each of the logical portions designated as a bent portion, computing a straight portion gate width and a straight portion effective length for of the logical portions designated as a straight portion, computing the total width of the bent gate from the corner portion gate width, the bent portion gate width, and the straight portion gate width, and computing the overall effective length of the bent gate from the corner portion effective length, the bent portion effective length, and the straight portion effective length.

2. The method of claim 1, wherein the step of computing the total width of the bent gate comprises computing the total width by:

total width=Σ(corner portion gate width)+Σ(bent portion gate width)+Σ(straight portion gate width), and the step of computing the overall effective length of the bent gate comprises computing the overall effective length by:

effective length=(total width)/(Σ(corner portion gate width)/(corner portion effective length)+Σ(bent portion gate width)/(bent portion effective length)+Σ(straight portion gate width)/((straight portion effective length)).

3. The method of claim 1, wherein the step of computing a corner portion gate width and a corner portion effective length for each logical portion designated as a corner portion comprises:

computing the corner portion gate width by

2πR(corner angle)/360, and computing the corner portion effective length by $L_{gate}/\cos((\text{corner angle})/2)$, where the corner angle is measured in degrees and $L_{gate}$ is a gate length as measured on a side of the corner portion.

4. The method of claim 1, wherein the step of computing a bent portion gate width and a bent portion effective length for each logical portion designated as a bent portion comprises:

computing the bent portion gate width by $\sqrt{2}(L_{jog})-(2R)\tan((\text{corner angle}/2)$, and computing the bent portion effective length by $L_{gate}$, where the corner angle is measured in degrees and $L_{gate}$ is a gate length as measured through the bent portion, and $L_{jog}$ is an offset measured between ends of the bent portion.

5. The method of claim 1, wherein the step of computing a straight portion gate width and a straight portion effective length for each logical portion designated as a straight portion comprises:

computing the straight portion gate width by $L_{str}-(2R+L_{gate})\tan((\text{corner angle}/2)$, and computing the straight portion effective length by $L_{gate}$, where the corner angle is measured in degrees, $L_{gate}$ is a gate length as measured on a side of the corner portion, and $L_{str}$ is a measure of an average length of the straight portion measured between ends of the straight portion.

6. The method of claim 1, further comprising the steps of:

computing a critical value for each bent portion and each straight portion, comparing the critical value for each bent portion and each straight portion to a characteristic value for each bent portion and each straight portion, and when the characteristic value is not greater than the critical value, then selectively computing the widths and the effective lengths for the bent portions and the straight portions using modified equations.

7. The method of claim 6, wherein:

the critical value for the bent portion is $(2R)\tan((\text{corner angle})/2)/\sqrt{2}$, and the characteristic value for the bent portion is $L_{jog}$, where R is a radius of a corner portion at an end of the bent portion, and corner angle is an angle of the corner portion at the end of the bent portion, and $L_{jog}$ is a measured offset between ends of the bent portion, and the critical value for the straight portion is $(2R+L_{gate})\tan((\text{corner angle})/2)$ and the characteristic value for the straight portion is $L_{str}$, where $L_{gate}$ is a gate length of the straight portion, and $L_{str}$ is an average width of the straight portion.

8. A method of characterizing a total width for a bent gate, comprising the steps of:

dividing the bent gate into logical portions, designating each of the logical portions as one of a bent portion, a corner portion, and a straight portion, computing a corner portion gate width for each of the logical portions designated as a corner portion, computing a bent portion gate width for each of the logical portions designated as a bent portion, computing a straight portion gate width for of the logical portions designated as a straight portion, and computing the total width of the bent gate from the corner portion gate width, the bent portion gate width, and the straight portion gate width.

9. The method of claim 8, wherein the step of computing the total width of the bent gate comprises computing the total width by total width=$\Sigma$(corner portion gate width)+$\Sigma$(bent portion gate width)+$\Sigma$(straight portion gate width).

10. The method of claim 8, wherein the step of computing a corner portion gate width for each logical portion designated as a corner portion comprises $2\pi R(\text{corner angle})/360$, where the corner angle is measured in degrees.

11. The method of claim 8, wherein the step of computing a bent portion gate width for each logical portion designated as a bent portion comprises $\sqrt{2}(L_{jog})-(2R)\tan((\text{corner angle}/2)$, where the corner angle is measured in degrees, and $L_{jog}$ is an offset measured between ends of the bent portion.

12. The method of claim 8, wherein the step of computing a straight portion gate width for each logical portion designated as a straight portion comprises $L_{str}-(2R+L_{gate})\tan((\text{corner angle}/2)$, where the corner angle is measured in degrees, $L_{gate}$ is a gate length as measured on a side of the corner portion, and $L_{str}$ is a measure of an average length of the straight portion measured between ends of the straight portion.

13. The method of claim 8, further comprising the steps of:

computing a critical value for each bent portion and each straight portion, comparing the critical value for each bent portion and each straight portion to a characteristic value for each bent portion and each straight portion, and when the characteristic value is not greater than the critical value, then selectively computing the widths for the bent portions and the straight portions using modified equations.

14. The method of claim 13, the critical value for the bent portion is $(2R)\tan((\text{corner angle}/2)/\sqrt{2}$, and the characteristic value far the bent portion is $L_{jog}$, where R is a radius of a corner portion at an end of the bent portion, and corner angle is an angle of the corner portion at the end of the bent portion, and $L_{jog}$ is a measured offset between ends of the bent portion, and the critical value for the straight portion is $(2R+L_{gate})\tan((\text{corner angle})/2)$ and the characteristic value for the straight portion is $L_{str}$, where $L_{gate}$ is a gate length of the straight portion, and $L_{str}$ is an average width of the straight portion.

15. A method of characterizing an overall effective length for a bent gate, comprising the steps of:

dividing the bent gate into logical portions, designating each of the logical portions as one of a bent portion, a corner portion, and a straight portion, computing a corner portion effective length for each, of the logical portions designated as a corner portion, computing a bent portion effective length for each of the logical portions designated as a bent portion, computing a straight portion effective length for of the logical portions designated as a straight portion, and computing the overall effective length of the bent gate from the corner portion effective length, the bent portion effective length, and the straight portion effective length.

16. The method of claim 15, wherein the step of computing the overall effective length of the bent gate comprises computing the overall effective length by effective length= (total width)/($\Sigma$(corner portion gate width)/(corner portion effective length)+$\Sigma$(bent portion gate width)/(bent portion effective length)+$\Sigma$(straight portion gate width)/(straight portion effective length)).

17. The method of claim 15, wherein the step of computing a corner portion effective length for each logical portion designated as a corner portion comprises $L_{gate}$/cos ((corner angle)/2), where the corner angle is measured in degrees and $L_{gate}$ is a gate length as measured on a side of the corner portion.

18. The method of claim 15, wherein the step of computing a bent portion effective length for each logical portion designated as a bent portion comprises $L_{gate}$, where $L_{gate}$ is a gate length as measured through the bent portion.

19. The method of claim 15, wherein the step of computing a straight portion effective length for each logical portion designated as a straight portion comprises $L_{gate}$, where $L_{gate}$ is a gate length as measured on a side of the corner portion.

20. The method of claim 15, further comprising the steps of:

computing a critical value for each bent portion and each straight portion, comparing the critical value for each bent portion and each straight portion to a characteristic value for each bent portion and each straight portion, and when the characteristic value is not greater than the critical value, then selectively computing the effective lengths for the bent portions and the straight portions using modified equations.

* * * * *